United States Patent
Wu et al.

(10) Patent No.: US 9,640,397 B2
(45) Date of Patent: May 2, 2017

(54) METHOD OF FABRICATING A SEMICONDUCTOR INTEGRATED CIRCUIT USING A DIRECTED SELF-ASSEMBLY BLOCK COPOLYMER

(71) Applicant: Taiwan Semiconductor Manufacturing Company, Ltd., Hsin-Chu (TW)

(72) Inventors: Chieh-Han Wu, Kaohsiung (TW); Chung-Ju Lee, Hsinchu (TW); Tien-I Bao, Taoyuan County (TW); Tsung-Yu Chen, Hsinchu (TW); Shinn-Sheng Yu, Hsinchu (TW); Yu-Fu Lin, Hsinchu (TW); Jeng-Horng Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 46 days.

(21) Appl. No.: 14/211,483

(22) Filed: Mar. 14, 2014

(65) Prior Publication Data
US 2015/0262815 A1  Sep. 17, 2015

(51) Int. Cl.
*H01L 21/311* (2006.01)
*H01L 21/033* (2006.01)
(Continued)

(52) U.S. Cl.
CPC ...... *H01L 21/0337* (2013.01); *H01L 21/0338* (2013.01); *H01L 21/2815* (2013.01);
(Continued)

(58) Field of Classification Search
CPC ............ H01L 21/0337; H01L 21/0332; H01L 21/308; H01L 21/3081; H01L 21/3086;
(Continued)

(56) References Cited

U.S. PATENT DOCUMENTS

2007/0148968 A1* 6/2007 Kwon ................ H01L 21/0337 438/671
2008/0311402 A1* 12/2008 Jung ...................... B82Y 10/00 428/409

(Continued)

OTHER PUBLICATIONS

Ross et al., Si-containing block copolymers for self-assembled nanolithography, Dec. 1, 2008, Journal of Vacuum Science & Technology B, vol. 26, pp. 2489-2494.*

(Continued)

*Primary Examiner* — David Chen
(74) *Attorney, Agent, or Firm* — Haynes and Boone, LLP

(57) ABSTRACT

A method of fabricating a semiconductor integrated circuit (IC) is disclosed. A first layer is deposited over a substrate. A plurality of mandrels is formed over the first layer. Guiding-spacers are formed along sidewalls of the mandrels. Then the mandrels are removed. A neutral layer (NL) and a block copolymer (BCP) layer are deposited over the first layer and the guiding-spacers. A anneal is applied to the BCP layer to form a first polymer nanostructure between the guiding-spacers and being surrounded by a second polymer nanostructure. The first polymer nanostructures locate at a same distance from the first layer. Polymer nano-blocks are formed by selectively etching the second polymer nanostructure and the NL. By using the polymer nano-blocks and the guiding spacer as etch masks, the first layer is etched to form openings. The substrate is etched through the openings to form substrate trench and substrate fin.

19 Claims, 6 Drawing Sheets

(51) Int. Cl.
*H01L 21/8234* (2006.01)
*H01L 21/308* (2006.01)
*H01L 21/28* (2006.01)

(52) U.S. Cl.
CPC ...... *H01L 21/3086* (2013.01); *H01L 21/3088* (2013.01); *H01L 21/823431* (2013.01)

(58) Field of Classification Search
CPC ............. H01L 21/0338; H01L 21/3088; H01L 21/76816; H01L 21/31144; H01L 21/32139; B81C 1/00031; B81C 2201/0149; B81C 2201/0198
USPC ....... 438/589, 700, 702, 947; 216/41, 49, 55
See application file for complete search history.

(56) References Cited

U.S. PATENT DOCUMENTS

| | | | | |
|---|---|---|---|---|
| 2009/0092803 | A1* | 4/2009 | Bita | C08F 297/02 428/209 |
| 2013/0244439 | A1* | 9/2013 | Ghariehali | H01L 21/3081 438/703 |
| 2013/0309457 | A1* | 11/2013 | Rathsack et al. | 428/195.1 |
| 2014/0072830 | A1* | 3/2014 | Lille et al. | 428/847 |
| 2014/0273290 | A1* | 9/2014 | Somervell | H01L 22/12 438/5 |
| 2014/0295669 | A1* | 10/2014 | Kawanishi | H01L 21/0271 438/702 |
| 2014/0346574 | A1* | 11/2014 | Cai | H01L 29/66795 257/288 |

OTHER PUBLICATIONS

Huda et al., Self-Assembled Nanodot Fabrication by Using PS-PDMS Block Copolymer, Jun. 13, 2012, INTECH, pp. 65-79.*

C.A. Ross et al., "Si-containing block copolymers for self-assembled nanolithography," 2008, pp. 2489-2494, vol. 26, Issue 6, Journal of Vacuum Science & Technology B: Microelectronics and Nanometer Structures.

Mark P. Stoykovich et al., "Block copolymers and conventional lithography," Sep. 2006, pp. 20-29, vol. 9, Issue 9, Materials Today.

* cited by examiner

METHOD OF FABRICATING A SEMICONDUCTOR INTEGRATED CIRCUIT USING A DIRECTED SELF-ASSEMBLY BLOCK COPOLYMER

BACKGROUND

The semiconductor integrated circuit (IC) industry has experienced rapid growth. Technological advances in IC design and material have produced generations of ICs where each generation has smaller and more complex circuits than previous generation. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. Although existing methods of fabricating IC devices have been generally adequate for their intended purposes, they have not been entirely satisfactory in all respects. For example, a feasible method of forming small critical dimension features, such as trenches and fins, is desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
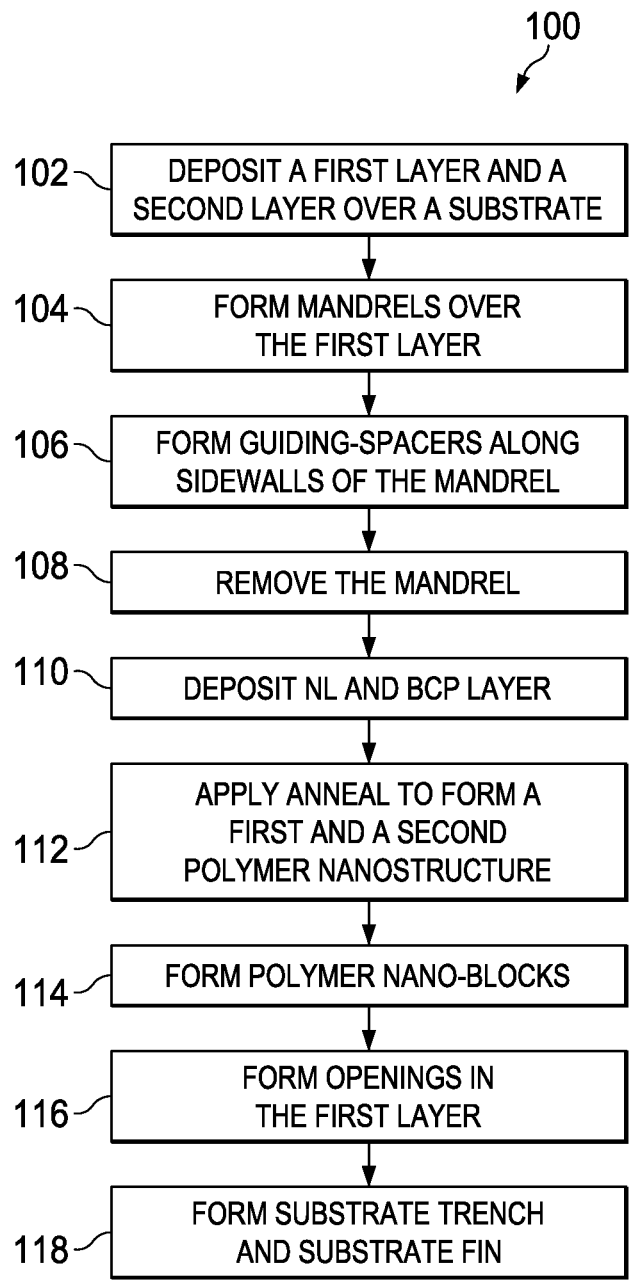
FIG. 1 is a flowchart of an example method for fabricating a semiconductor integrated circuit (IC) constructed in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flowchart of a method 100 of fabricating one or more IC devices in accordance with some embodiments. The method 100 is discussed in detail below, with reference to an IC device 200, shown in FIGS. 2 to 8, 9A to 9B, and 10 for the sake of example.

Figure 2:
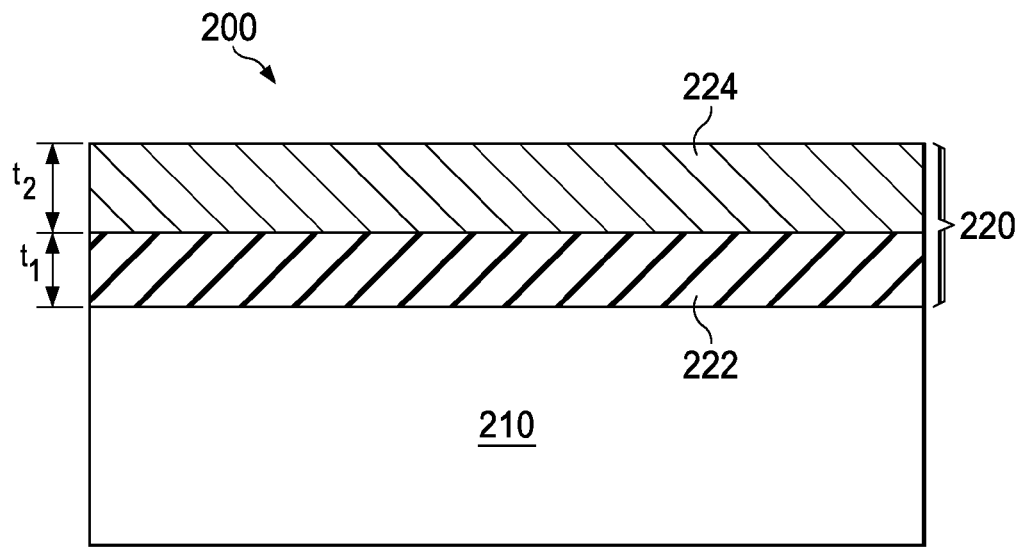
FIGS. 2 to 8, 9A to 9B, and 10 are cross sectional views of an example IC device constructed at fabrication stages constructed in accordance with some embodiments.

Referring to FIGS. 1 and 2, the method 100 begins at step 102 by forming a film stack 220 over a substrate 210. The substrate 210 may include an elementary semiconductor, such as silicon and germanium. The substrate 210 may also include a compound semiconductor such as silicon carbide, gallium arsenic, indium arsenide, and indium phosphide. The substrate 210 may include an alloy semiconductor such as silicon germanium, silicon germanium carbide, gallium arsenic phosphide, and gallium indium phosphide. The substrate 210 may also include an epitaxial layer. For example, the substrate 210 may have an epitaxial layer overlying a bulk semiconductor. Furthermore, the substrate 210 may include a semiconductor-on-insulator (SOI) structure. For example, the substrate 210 may include a buried oxide (BOX) layer formed by a process such as separation by implanted oxygen (SIMOX) or other suitable technique, such as wafer bonding and grinding.

The film stack 220 includes a first layer 222 deposited over the substrate 210 and a second layer 224 deposited over the first layer 222. The first layers of 222 and the second layer 224 may include silicon oxide, silicon nitride, oxynitride, silicon carbide, titanium oxide, titanium nitride, tantalum oxide, tantalum nitride, or any suitable materials. In the present embodiment, the second layer 224 may include a material which is different from the first layer 222 to achieve etching selectivity during subsequent etch processes. The first layer 222 and the second layer 224 may be deposited by chemical vapor deposition (CVD), atomic layer deposition (ALD), spin-on coating, or other suitable method.

The first layer 222 and the second layer 224 have a first thickness $t_1$ and a second thickness $t_2$ respectively. The first thicknesses $t_1$ is designed to provide an adequate thickness of an etch mask layer for a subsequent etch step and the second thickness $t_2$ is designed to be one of factors to define a height of a guiding-spacer formed in a subsequent step, which will be described in the following description.

Figure 3:
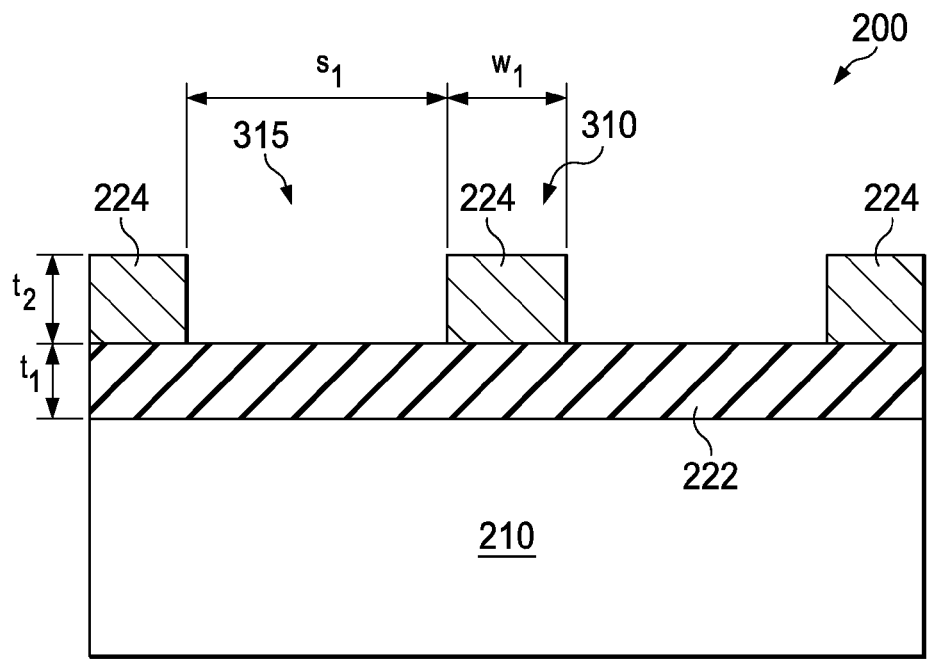

Referring to FIGS. 1 and 3, the method 100 proceeds to step 104 by forming a plurality of mandrels 310 over the first layer 222. The mandrels 310 are formed with a first width $w_1$ and a first spacing $s_1$ of a first space 315 between two adjacent mandrels. The first width $w_1$ and the first spacing $s_1$ are designed to be satisfied with a relationship of a future substrate trench and a future substrate fin, which will be described in the following description.

In one embodiment, the mandrels 310 are formed by etching the second layer 224 through a patterned photoresist layer. Generally, a patterning process may include photoresist coating (e.g., spin-on coating), exposing, developing the photoresist, other suitable processes, or combinations thereof. Alternatively, the photolithography exposing process is implemented or replaced by other proper methods such as maskless photolithography, electron-beam writing, direct-writing, and/or ion-beam writing. The second layer 224 is then etched through the pattern photoresist layer to form the mandrels 310. The second layer 224 may be etched by various methods, including a dry etch, a wet etch, or a combination of thereof. In one embodiment, the second layer 224 is etched selectively, which does not substantially etch the first layer 222, to gain etch process window improvement.

Figure 4:
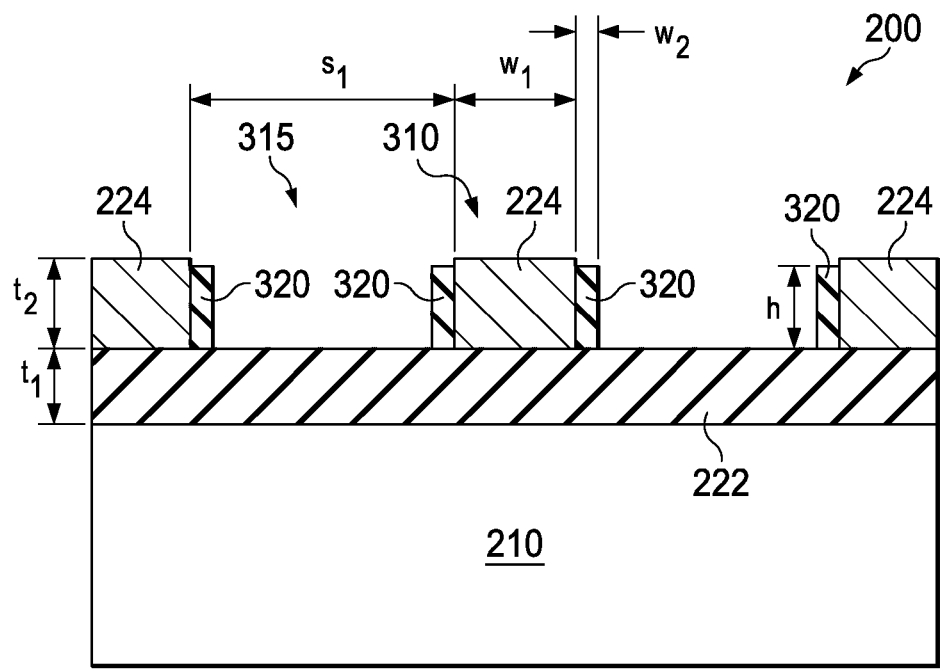

Referring to FIGS. 1 and 4, the method 100 proceeds to step 106 by forming guiding-spacers 320 along sidewalls of the mandrels 310. The guiding-spacers 320 may serve as guiding structures for a block copolymer (BCP) layer assembly process, which will be described in the following description. Guiding-spacers 320 may be formed by depositing a spacer layer over the first layer 222 and the plurality of mandrels 310, including sidewalls of the plurality of the mandrels 310. A spacer etch is then applied to etch the spacer layer anisotropically to remove the spacer layer on top of the mandrels 310 and on the first layer 222. The spacer layer may include silicon oxide, silicon nitride, oxynitride, silicon carbide, titanium oxide, titanium nitride, tantalum oxide, tantalum nitride, or any suitable materials. The spacer layer may be deposited by CVD, ALD, or other suitable method. In one embodiment, the spacer layer includes a material which is different from the first layer 222 to achieve etching selectivity during spacer etch. The spacer etch may include a plasma dry etch.

By controlling the thickness of the spacer layer, the guiding-spacers 320 are formed to have a target width, a second width $w_2$, which can be quite small, such as about 10 nm. Additionally, being formed by spacer processes, the second width $w_2$ of the guiding-spacers 320 can be made relatively uniform across different areas, including where there may be different pattern densities from one area to another area. In one embodiment, the second width $w_2$ is design to be a width of the future substrate fin, which will be described in the following description. By choosing the second thickness $t_2$ of the second layer 224 and controlling the spacer etch depth, the guiding-spacers 320 are formed to have a target height, h. The height h is designed to guide a formation of a plurality of self-assembled nanostructures in a subsequent step, which will be described in the following description. As an example, the height h is in a range from 100 Å to 400 Å.

Figure 5:
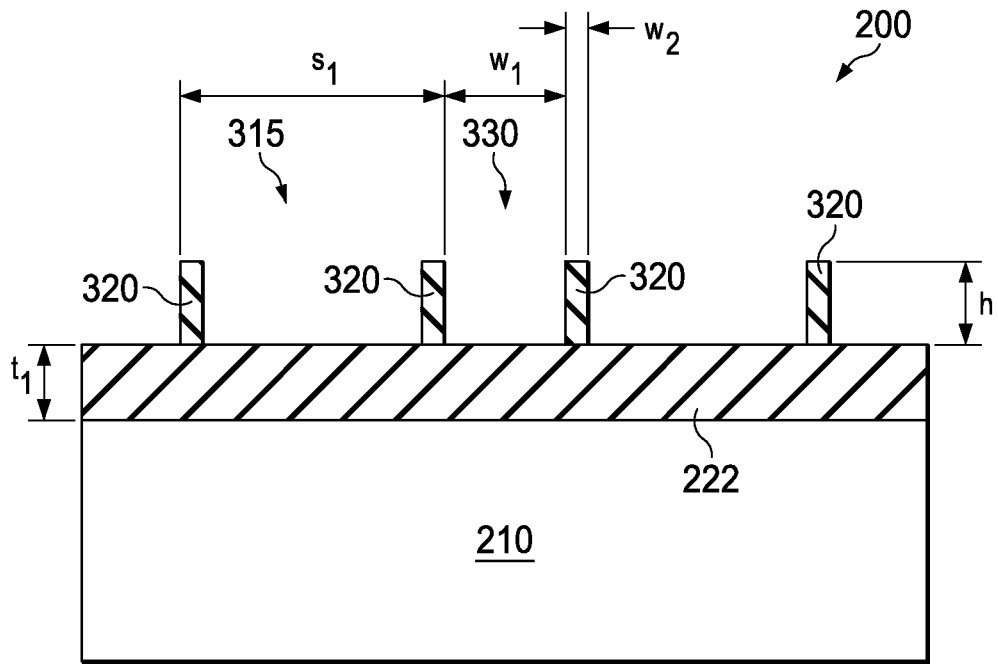

Referring to FIGS. 1 and 5, the method 100 proceeds to step 108 by removing the mandrels 310. In one embodiment, the mandrels 310 may be removed by a selective dry etch, a selective wet etch, or combination thereof. The etching selectively removes the mandrels 310 but does not substantially etch the guiding-spacers 320 and the first layer 222. After removing the mandrels 310, second spacers 330 are formed with a same width of the first width $w_1$.

Figure 6:
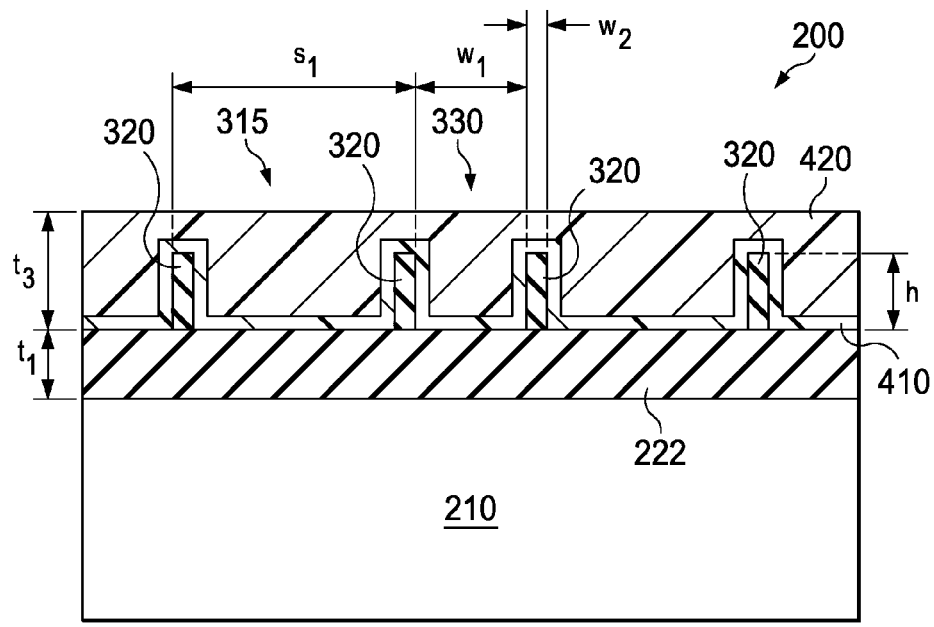

Referring to FIGS. 1 and 6, the method 100 proceeds to step 110 by depositing a neutral layer (NL) 410 and a directed self-assembly (DSA) block copolymer (BCP) layer 420 over the first layer 222 and the guiding-spacers 320. The NL 410 may include materials that having a surface energy which is in the middle of the two components in the BCP layer 420. As an example, the NL 410 includes polystyrene with OH functional group. The NL 410 may be deposited by ALD, CVD, spin-on coating, or other suitable process.

The BCP layer 420 is then deposited over the NL 410 to fill in the first space 315 and the second space 330. A BCP includes polymers comprised of at least two different polymer segments, and these polymer segments can assemble themselves into highly ordered structures under certain conditions, such as when they are exposed to an elevated temperature. The BCP layer 420 may include one or more of polystyrene-block-polydimethylsiloxane block copolymer (PS-b-PDMS), polystyrene-block-polymethylmethacrylate (PS-b-PMMA), polyethyleneoxide-block-polyisoprene (PEO-b-PI), polyethyleneoxide-block-polybutadiene (PEO-b-PBD), polyethyleneoxide-block-polystyrene (PEO-b-PS), polyethyleneoxide-block-polymethylmethacrylate (PEO-b-PMMA), polyethyleneoxide-block-polyethylethylene (PEO-b-PEE), polystyrene-block-polyvinylpyridine (PS-b-PVP), polystyrene-block-polyisoprene (PS-b-PI), polystyrene-block-polybutadiene (PS-b-PBD), polystyrene-block-polyferrocenyldimethylsilane (PS-b-PFS), polybutadiene-block-polyvinylpyridine (PBD-b-PVP), and polyisoprene-block-polymethylmethacrylate (PI-b-PMMA).

The BCP layer 420 may be deposited by spin-on coating, spraying, dip coating, or other suitable methods. In one embodiment, the BCP layer 420 includes a PS-b-PDMS deposited by spin-on coating. The BCP layer 420 is formed with a designed thickness, a third thickness $t_3$.

Figure 7:
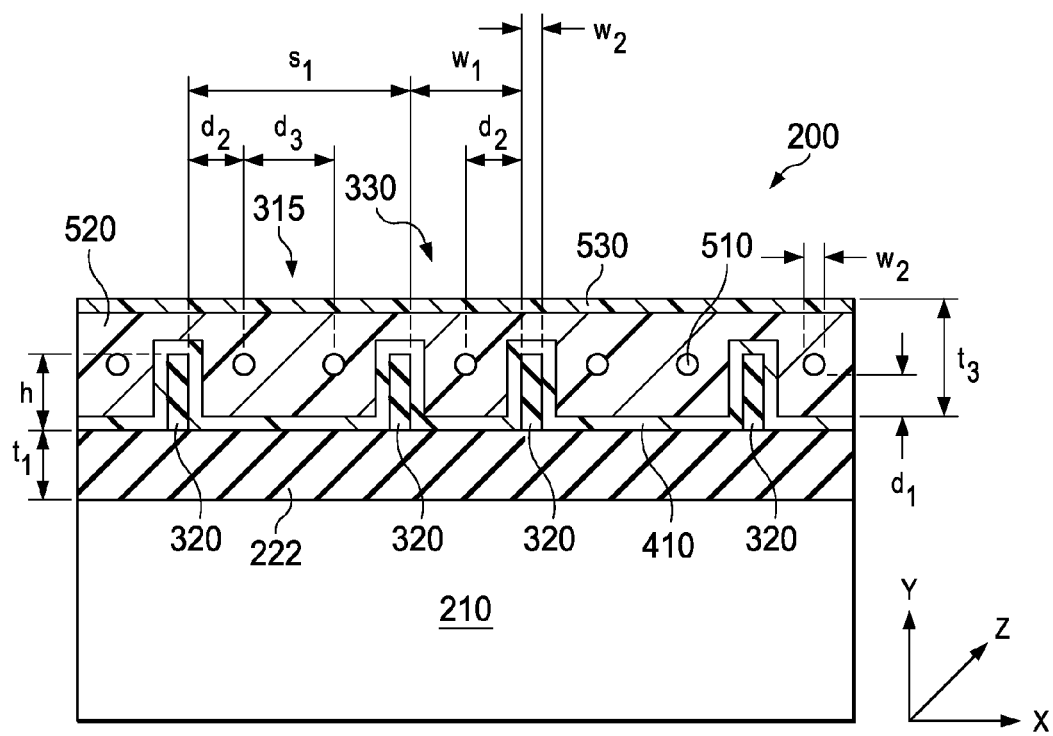

Referring to FIGS. 1 and 7, the method 100 proceeds to step 112 by applying a first elevated temperature anneal to achieve segregation in the BCP layer 420 to form first and second polymer nanostructures, 510 and 520. In one embodiment, by choosing the height h of the guiding-spacer 320, the third thickness $t_3$ and the materials of the BCP layer 420, the first polymer nanostructures 510 are formed such that they have a width same as the width $w_2$ of the guiding-spacer 320, they are parallel to each other and stay in locations with a same distance, a first distance $d_1$, from the NL 410. The first distance $d_1$ is targeted to be adequate for a thickness of a future hard mask, which will be described in the following description. The first polymer nanostructures 510 are formed to be along a Z direction, which is perpendicular to both of a direction along the width of the guiding-spacer 320, X direction, and a direction along the height of the guiding-spacer 320, a Y direction (as shown in FIG. 7).

As has been mentioned previously, by choosing the first spacing $s_1$ and the first width $w_1$, a second distance $d_2$ between adjacent first polymer nanostructures 510 and the guiding-spacers 320 and a third distance $d_3$ between two adjacent first polymer nanostructures 510 (within the same second space 330) are able to be adjusted. In one embodiment, the second distance $d_2$ is the same as the third distance $d_3$.

In one embodiment, the PS-b-PDMS layer 420 is annealed with a temperature of about 250° C. and forms self-assembled PDMS nanostructure 510 surrounded by the PS layer 520 and also a PDMS layer 530 on top of the PS layer 520. The PDMS nanostructures 510 are formed in cylindrical-shape and parallel to each other along the Z direction. The PDMS nanostructures 510 are formed such that they are in locations with a same distance, the first distance $d_1$, from the NL 410, have a same width as the second width $w_2$ and have the second distance $d_2$, which is same as the third distance $d_3$.

Figure 8:
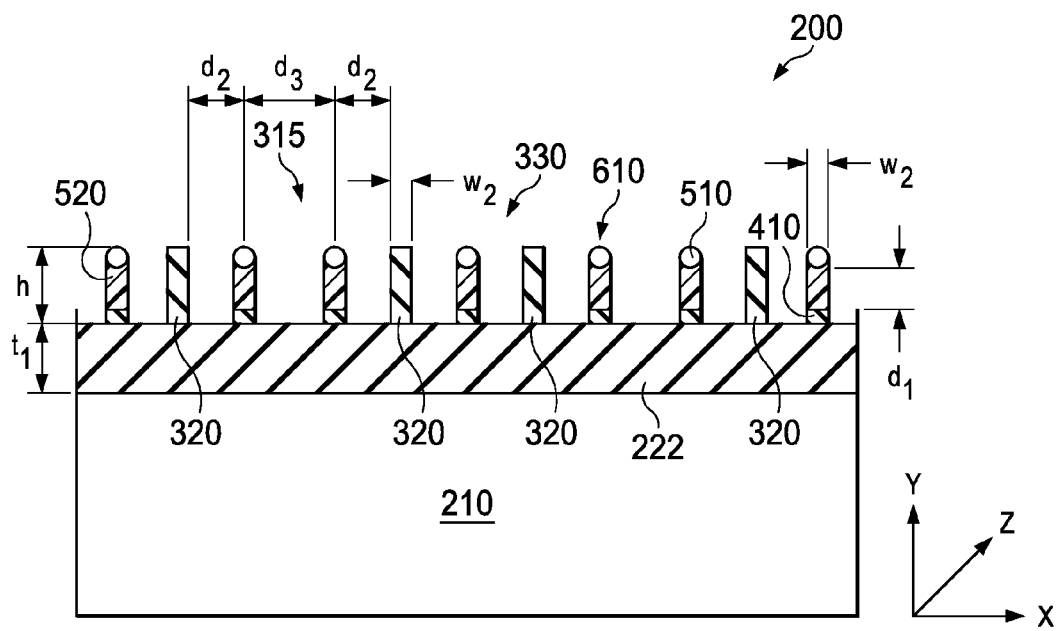

Referring to FIGS. 1 and 8, the method 100 proceeds to step 114 by forming polymer nano-blocks 610. The polymer nano-blocks 610 are formed by selectively etching the second polymer nanostructure 520, as well as the NL 410, but substantially not etching the first polymer nanostructures 510. Therefore the polymer nano-blocks 610 have a same width as the width of the first polymer nanostructure 510, $w_2$. The selective etch may include dry etch, wet etch, or combinations thereof.

In one embodiment, where the self-assembled PDMS nanostructure 510 surrounded by the PS layer 520 and also a PDMS layer 530 on top of the PS layer 520, the PDMS layer 530 is removed first, then the cylindrical-shape PDMS nanostructures 510 serve as an etch mask to protect the PS layer 520 underneath it while etching the PS layer 520 and the NL 410, as shown in FIG. 8. The protected PS layer 520 forms polymer nano-block 610 with a same width as the second width $w_2$ and a height same as the first distance $d_1$.

Figure 9A:
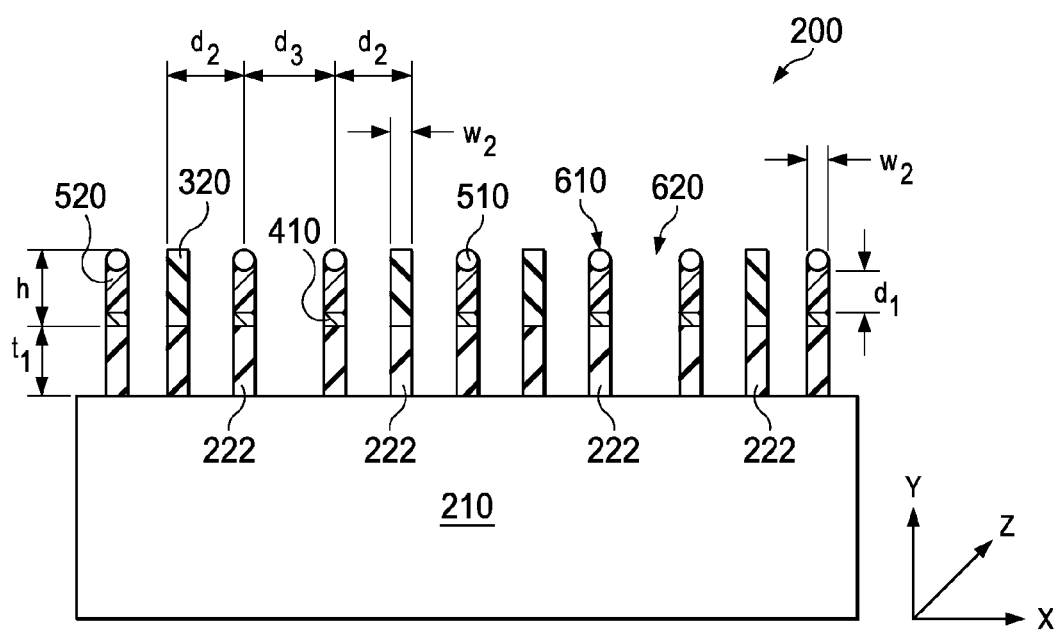
Figure 9B:
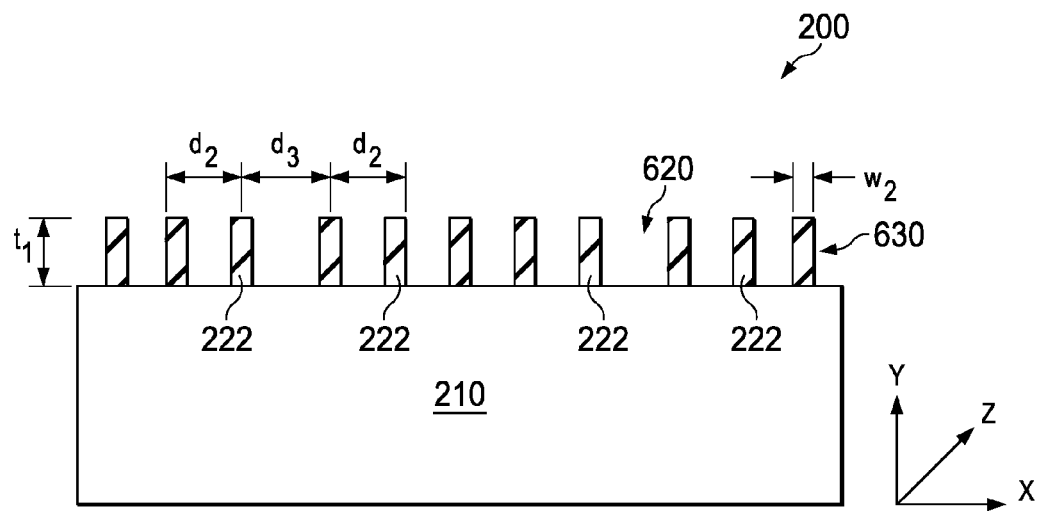

Referring to FIGS. 1 and 9A to 9B, the method 100 proceeds to step 116 by etching the first layer 222 using the nano-block 610 and the guiding-spacer 320 as etch masks to form openings 620 to expose the substrate 210, as shown in FIG. 9A. Therefore, the openings 620 carry respective widths as the second distance $d_2$ or the third distance $d_3$. As has been mentioned previously, a height of the nano-block 610, defined by the height h of the guiding-spacer 320 and the first distance $d_1$ are targeted to be adequate as the etch mask during etching the first layer 222. After forming the openings 620, the nano-blocks 610 and the guiding-spacers 320 is selectively removed, Thus the first layer 222 with openings 620 are referred to as a patterned hard mask layer 630, as shown in FIG. 9B. The selective etches include dry etch, wet etch, or combinations thereof.

Figure 10:
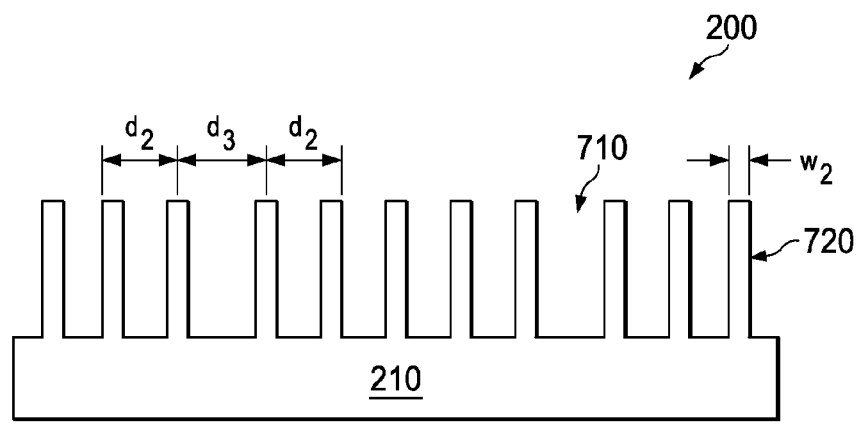

Referring to FIGS. 1 and 10, the method 100 proceeds to step 118 by forming the substrate trenches 710 and substrate fins 720 over the substrate 210. The substrate trenches 710 and the substrate fins 720 are formed by etching the substrate 210 using the patterned hard mask layer 630 as an etch mask. As has been mentioned previously, the first thickness $t_1$ of the first layer 222 is designed to be adequate as an etch mask. The etch includes dry etch, wet etch, or combinations thereof. As an example, dry etching processes include a biased plasma etching process that uses a chlorine-based chemistry. The substrate trench 710 carries a respective width of the opening 620, $d_2$ or $d_3$, and the substrate fin 720 carries same width as the second width $w_2$. In one embodiment, $d_2$, $d_3$ and $w_2$ are in a range from 5 nm to 30 nm. The patterned hard mask layer 630 is removed by any suitable processed, including wet etch and dry etch.

Additional steps can be provided before, during, and after the method 100, and some of the steps described can be replaced, eliminated, or moved around for additional embodiments of the method 100. The device 200 may undergo further CMOS or MOS technology processing to form various features and regions known in the art.

Based on the above, the present disclosure offers methods for fabricating IC device. The method employs forming a guiding-spacer to guide the BCP layer assembly. Instead of defining by lithography, the method provides an integration of deposition and etching processes for forming a quite small critical dimension guiding structure for BCP layer assembly process. The method demonstrates uniformity improvement of the guiding structure across areas where pattern density may vary substantially.

The present disclosure provides many different embodiments of fabricating a semiconductor IC that provide one or more improvements over other existing approaches. In one embodiment, a method for fabricating a semiconductor integrated circuit (IC) includes depositing a first layer over a substrate, forming a plurality of mandrels over the first layer, forming guiding-spacers along sidewalls of the mandrels, removing mandrels, depositing a neutral layer (NL) and a block copolymer (BCP) layer over the first layer and the guiding-spacers, annealing the BCP layer to form polymer nanostructures between the guiding-spacers. The polymer nanostructures include first polymer nanostructures surrounded by second polymer nanostructures. The first polymer nanostructures are located at a common distance from the first layer. The method also includes forming polymer nano-blocks by selectively etching the second polymer nanostructure and the NL, forming openings in the first layer by using the polymer nano-blocks and the guiding spacer as etch masks and etching the substrate through the openings to form a substrate trench and a substrate fin.

In another embodiment, a method for fabricating a semiconductor IC includes depositing a first layer over a substrate, depositing a second layer over the first layer, removing a portion of the second layer to form mandrels over the first layer, forming guiding-spacers along sidewalls of the mandrels, removing mandrels, depositing a neutral layer (NL) over the first layer and the guiding-spacers, depositing a block copolymer (BCP) layer over the NL and filling in a space between two guiding-spacers, annealing the BCP layer to form a first polymer nanostructure between the guiding-spacers and surrounded by a second polymer nanostructure. The first polymer nanostructures are formed such that they locate at a same distance from the first layer, they parallel to each other and they are along a direction which is perpendicular to a direction along the width of the guiding-spacer and a direction along the height of the guiding-spacer. The method also includes selectively etching the second polymer nanostructure and the NL to forming polymer nano-blocks with a width same as the a width of the first polymer nanostructure, forming openings in the first layer by using the polymer nano-blocks and the guiding spacer as etch masks and etching the substrate through the openings to form substrate trench and substrate.

In yet another embodiment, a method for fabricating a semiconductor IC includes depositing a first layer over a substrate, depositing a second layer over the first layer, removing a portion of the second layer to form mandrels over the first layer, forming guiding-spacers along sidewalls of the mandrels, removing mandrels, depositing a neutral layer (NL) over the first layer and the guiding-spacers, depositing a PS-b-PDMS layer over the NL and filling in a space between two guiding-spacers. The method also includes annealing the PS-b-PDMS layer to form cylindrical-shape PDMS nanostructures between the guiding-spacers and surrounded by a PS layer. The cylindrical-shape PDMS nanostructures are formed such that they are: located at a same distance from the first layer, parallel to each other and arranged along a direction which is perpendicular to a direction along the width of the guiding-spacer and a direction along the height of the guiding-spacer. The method also includes selectively removing the PS layer and the NL and using the PDMS nanostructure as an etch mask to protect the PS layer underneath of it. The protected PS layer forms polymer nano-blocks. The method also includes forming openings in the first layer by using the polymer nano-blocks and the guiding spacer as etch masks and etching the substrate through the openings to form a substrate trench and a substrate fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor integrated circuit (IC), the method comprising:
depositing a first layer over a substrate;
forming a plurality of mandrels over the first layer;
forming guiding-spacers along sidewalls of the mandrels, wherein the forming the guiding-spacers includes depositing a spacer layer and etching the spacer layer to form the guiding-spacers having a height;
after forming the guiding-spacers, removing the mandrels;
depositing a neutral layer (NL) and a block copolymer (BCP) layer over the first layer and the guiding-spacers;
inducing separation of the BCP layer into:
a top layer of a first polymer; and
nanostructures of the first polymer disposed within a layer of a second polymer different from the first polymer, wherein the height of the guiding-spacers relative to the first layer is substantially the same as a height of the nanostructures of the first polymer relative to the first layer;
performing a multi-part etch, wherein the multi-part etch includes:
removing the top layer of the first polymer; and
thereafter, etching portions of the second polymer and the NL not covered by the nanostructures;
forming openings in the first layer by using the nanostructures and the guiding-spacers as etch masks; and
etching the substrate through the openings to form a substrate trench and a substrate fin.

2. The method of claim 1, wherein forming the mandrels includes:
depositing a second layer over the first layer;
forming a patterned photoresist layer over the second layer;
etching the second layer through the patterned photoresist layer; and
removing the patterned photoresist layer.

3. The method of claim 1, wherein the guiding-spacers are formed with a predetermined width d by controlling a thickness of the spacer layer, wherein the predetermined width d is a width of the substrate fin.

4. The method of claim 1, wherein the nanostructures are formed parallel to each other and along a direction which is perpendicular to a direction along a width of the guiding-spacers and a direction along the height of the guiding-spacers.

5. The method of claim 1, wherein a first distance between two adjacent nanostructures and a second distance between one of the two adjacent nanostructures and one of the guiding-spacers are adjusted by choosing a width of the mandrels and a space between two adjacent mandrels.

6. The method of claim 5, wherein the first distance is same as the second distance.

7. The method of claim 1, wherein by choosing the height of the guiding-spacers and a thickness and material of the BCP layer, the nanostructures are formed with a width same as a width of the guiding-spacers.

8. The method of claim 1, wherein the nanostructures are formed with a same width as a width of the guiding-spacers.

9. The method of claim 1, wherein the BCP layer includes one or more materials from the group consisting of polystyrene-block-polydimethylsiloxane block copolymer (PS-b-PDMS), polystyrene-block-polymethylmethacrylate (PS-b-PMMA), polyethyleneoxide-block-polyisoprene (PEO-b-PI), polyethyleneoxide-block-polybutadiene (PEO-b-PBD), polyethyleneoxide-block-polystyrene (PEO-b-PS), polyethyleneoxide-block-polymethylmethacrylate (PEO-b-PMMA), polyethyleneoxide-block-polyethylethylene (PEO-b-PEE), polystyrene-block-polyvinylpyridine (PS-b-PVP), polystyrene-block-polyisoprene (PS-b-PI), polystyrene-block-polybutadiene (PS-b-PBD), polystyrene-block-polyferrocenyldimethylsilane (PS-b-PFS), polybutadiene-block-polyvinylpyridine (PBD-b-PVP), and polyisoprene-block-polymethylmethacrylate (PI-b-PMMA).

10. The method of claim 9, wherein the BCP layer includes PS-b-PDMS, the first polymer includes polydimethylsiloxane (PDMS), and the second polymer includes polystyrene (PS),
and wherein each of the nanostructures has a cylindrical shape.

11. The method of claim 5, wherein by using both of the guiding-spacers and the nanostructures as the etch mask in forming the openings in the first layer, each of the openings is formed with a same width as at least one of the first distance or the second distance.

12. The method of claim 1, wherein by using the first layer with the openings in etching the substrate to form the substrate trench, a width of the substrate trench is the same as a width of the openings.

13. The method of claim 1, wherein the substrate fin is formed to have a same width as a width of the guiding-spacers.

14. A method for fabricating a semiconductor integrated circuit (IC), the method comprising:
depositing a first layer over a substrate;
depositing a second layer over the first layer;
removing a portion of the second layer to form mandrels over the first layer;
forming guiding-spacers having a height along sidewalls of the mandrels;
after forming the guiding-spacers having the height, removing the mandrels;
depositing a neutral layer (NL) over the first layer and the guiding-spacers;
depositing a directed self-assembly (DSA) material over the NL and filling in a space between two guiding-spacers;
annealing the DSA material to form first polymer nanostructures between the guiding-spacers and second polymer nanostructures surrounding the first polymer nanostructures, wherein the first polymer nanostructures are formed such that they are:
located at a common distance from the first layer;
parallel to each other; and
arranged along a direction which is perpendicular to a direction along a width of the guiding-spacers and a direction along the height of the guiding-spacers,
wherein the guiding-spacers are configured such that the height of the guiding-spacers is substantially equal to a height of the first polymer nanostructures;
selectively etching the second polymer nanostructures and the NL not covered by the first polymer nanostructures;
forming openings in the first layer by using the first polymer nanostructures and the guiding-spacers as etch masks;
removing the first polymer nanostructures and the guiding-spacers after forming the openings; and
thereafter, etching the substrate through the openings to form a substrate trench and a substrate fin.

15. The method of claim 14, wherein the DSA material includes one or more materials from the group consisting of polystyrene-block-polydimethylsiloxane block copolymer (PS-b-PDMS), polystyrene-block-polymethylmethacrylate (PS-b-PMMA), polyethyleneoxide-block-polyisoprene (PEO-b-PI), polyethyleneoxide-block-polybutadiene (PEO-b-PBD), polyethyleneoxide-block-polystyrene (PEO-b-PS), polyethyleneoxide-block-polymethylmethacrylate (PEO-b-PMMA), polyethyleneoxide-block-polyethylethylene (PEO-b-PEE), polystyrene-block-polyvinylpyridine (PS-b-PVP), polystyrene-block-polyisoprene (PS-b-PI), polystyrene-block-polybutadiene (PS-b-PBD), polystyrene-block-polyferrocenyldimethylsilane (PS-b-PFS), polybutadiene-block-polyvinylpyridine (PBD-b-PVP), and polyisoprene-block-polymethylmethacrylate (PI-b-PMMA).

16. The method of claim 15,
wherein the DSA material includes PS-b-PDMS and is annealed to form the first polymer nanostructures to include polydimethylsiloxane (PDMS) and the second polymer nanostructures to include polystyrene (PS), and
wherein each of the first polymer nanostructures has a cylindrical shape.

17. A method for fabricating a semiconductor integrated circuit, the method comprising:
receiving a substrate having a first masking material disposed thereupon and a second masking material disposed on the first masking material;
patterning the second masking material to define a mandrel;
forming a spacer having a topmost surface and disposed along a side surface of the mandrel;
after forming the spacer, removing the mandrel;
depositing a block copolymer material on the substrate alongside the spacer;
inducing the block copolymer material to separate into:
a top layer of a first material;
a plurality of regions of the first material disposed within a region of a second material different from the first material, wherein the topmost surface of the spacer is substantially coplanar with a topmost surface of each of the plurality of regions of the first material;
selectively removing the top layer;
etching the second material to remove a portion of the second material not covered by the plurality of regions of the first material;
patterning the first masking material using the plurality of regions of the first material and the spacer; and
thereafter, patterning the substrate using the patterned first masking material.

18. The method of claim 17 further comprising removing the plurality of regions of the first material and the spacer after the patterning of the first masking material and before the patterning of the substrate.

19. The method of claim 17, wherein the second masking material includes at least one material from the group consisting of: silicon oxide, silicon nitride, oxynitride, silicon carbide, titanium oxide, titanium nitride, tantalum oxide, and tantalum nitride.

* * * * *